US012598970B2

(12) United States Patent (10) Patent No.: US 12,598,970 B2
Anderson et al. (45) Date of Patent: Apr. 7, 2026

(54) TOP VIA ON SUBTRACTIVELY ETCHED CONDUCTIVE LINE

(71) Applicant: INTERNATIONAL BUSINESS MACHINES CORPORATION, Armonk, NY (US)

(72) Inventors: Brent Anderson, Jericho, VT (US); Lawrence A. Clevenger, Saratoga Springs, NY (US); Kisik Choi, Watervliet, NY (US); Nicholas Anthony Lanzillo, Wynantskill, NY (US); Christopher J. Penny, Saratoga Springs, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 176 days.

(21) Appl. No.: 17/683,579

(22) Filed: Mar. 1, 2022

(65) Prior Publication Data

US 2022/0223473 A1 Jul. 14, 2022

Related U.S. Application Data

(62) Division of application No. 16/821,428, filed on Mar. 17, 2020, now Pat. No. 11,276,611.

(51) Int. Cl.
| | |
|---|---|
| *H01L 21/768* | (2006.01) |
| *H01L 21/02* | (2006.01) |
| *H01L 21/04* | (2006.01) |
| *H01L 21/3105* | (2006.01) |

(52) U.S. Cl.
CPC .. *H01L 21/76897* (2013.01); *H01L 21/02362* (2013.01); *H01L 21/02697* (2013.01); *H01L 21/0475* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 9,365,946 B2 | 6/2016 | Busnaina et al. | |
| 9,589,093 B2 | 3/2017 | Hong | |
| 9,613,861 B2 | 4/2017 | Anderson et al. | |
| (Continued) | | | |

FOREIGN PATENT DOCUMENTS

WO WO-2019222234 A1 * 11/2019 ....... H01L 21/76801

OTHER PUBLICATIONS

List of IBM Patents or Patent Applications Treated as Related dated Mar. 1, 2022, 2 pages.

*Primary Examiner* — Alexander G Ghyka

(74) *Attorney, Agent, or Firm* — Tutunjian & Bitetto, P.C.; Robert Richard Aragona

(57) ABSTRACT

A method for fabricating a semiconductor device including a self-aligned top via includes subtractively etching a conductive layer to form at least a first conductive line on a substrate. After the subtractive etching, the method further includes forming a barrier layer along the substate and along the first conductive line, planarizing at least portions of the barrier layer to obtain at least an exposed first conductive line, recessing at least the exposed first conductive line to form a first recessed conductive line, and forming conductive material in a via opening on the first recessed conductive line.

13 Claims, 4 Drawing Sheets

300

(56) References Cited

U.S. PATENT DOCUMENTS

| | | | |
|---|---|---|---|
| 10,090,247 B1 * | 10/2018 | Briggs | H01L 21/76861 |
| 10,199,264 B2 | 2/2019 | Zhang et al. | |
| 10,204,829 B1 | 2/2019 | Amanapu et al. | |
| 2005/0242444 A1 * | 11/2005 | Huang | H01L 23/5283 |
| | | | 257/E23.152 |
| 2008/0124484 A1 | 5/2008 | Shinriki et al. | |
| 2012/0032335 A1 * | 2/2012 | Kariya | H01L 24/19 |
| | | | 257/772 |
| 2015/0056800 A1 | 2/2015 | Mebarki et al. | |
| 2015/0243544 A1 * | 8/2015 | Alptekin | H01L 21/7682 |
| | | | 438/586 |
| 2017/0040216 A1 | 2/2017 | Anderson et al. | |
| 2018/0082946 A1 * | 3/2018 | Clevenger | H01L 23/5226 |
| 2018/0269150 A1 | 9/2018 | Lin et al. | |
| 2019/0164815 A1 | 5/2019 | Lin et al. | |
| 2019/0198444 A1 | 6/2019 | Amanapu et al. | |
| 2019/0304912 A1 * | 10/2019 | Ecton | H01L 23/5386 |
| 2019/0363048 A1 * | 11/2019 | Zhao | H01L 23/5226 |

* cited by examiner

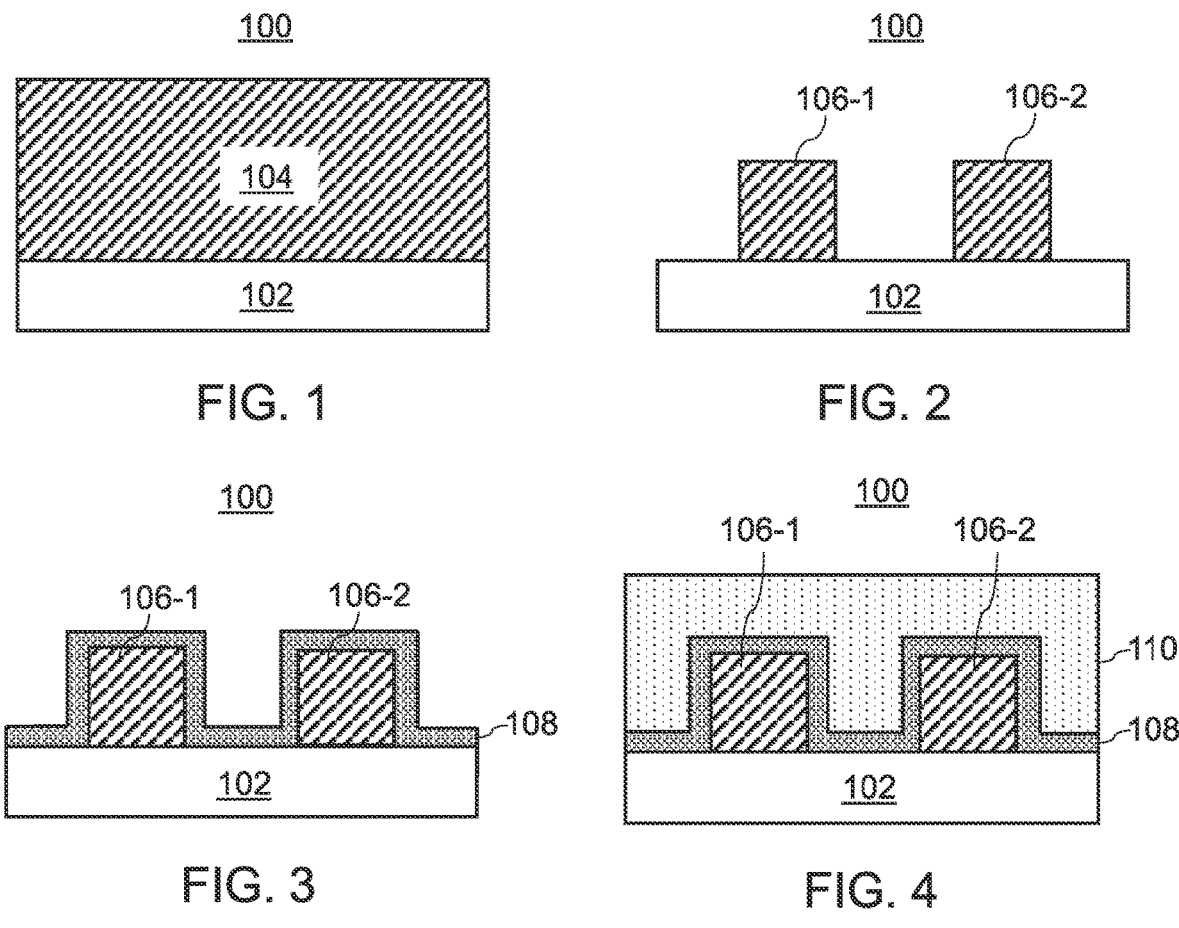
100
104
102
FIG. 1
100
106-1          106-2
102
FIG. 2
100
106-1          106-2
108
102
FIG. 3
100
106-1          106-2
110
108
102
FIG. 4
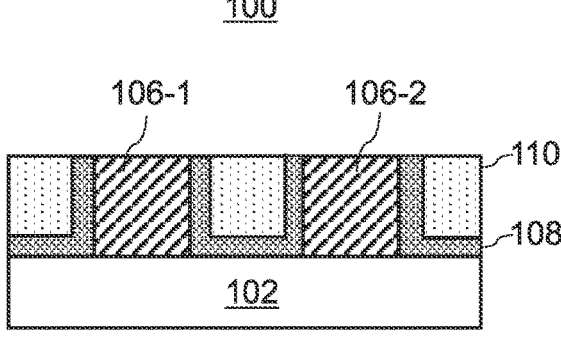
100
106-1          106-2
110
108
102
FIG. 5

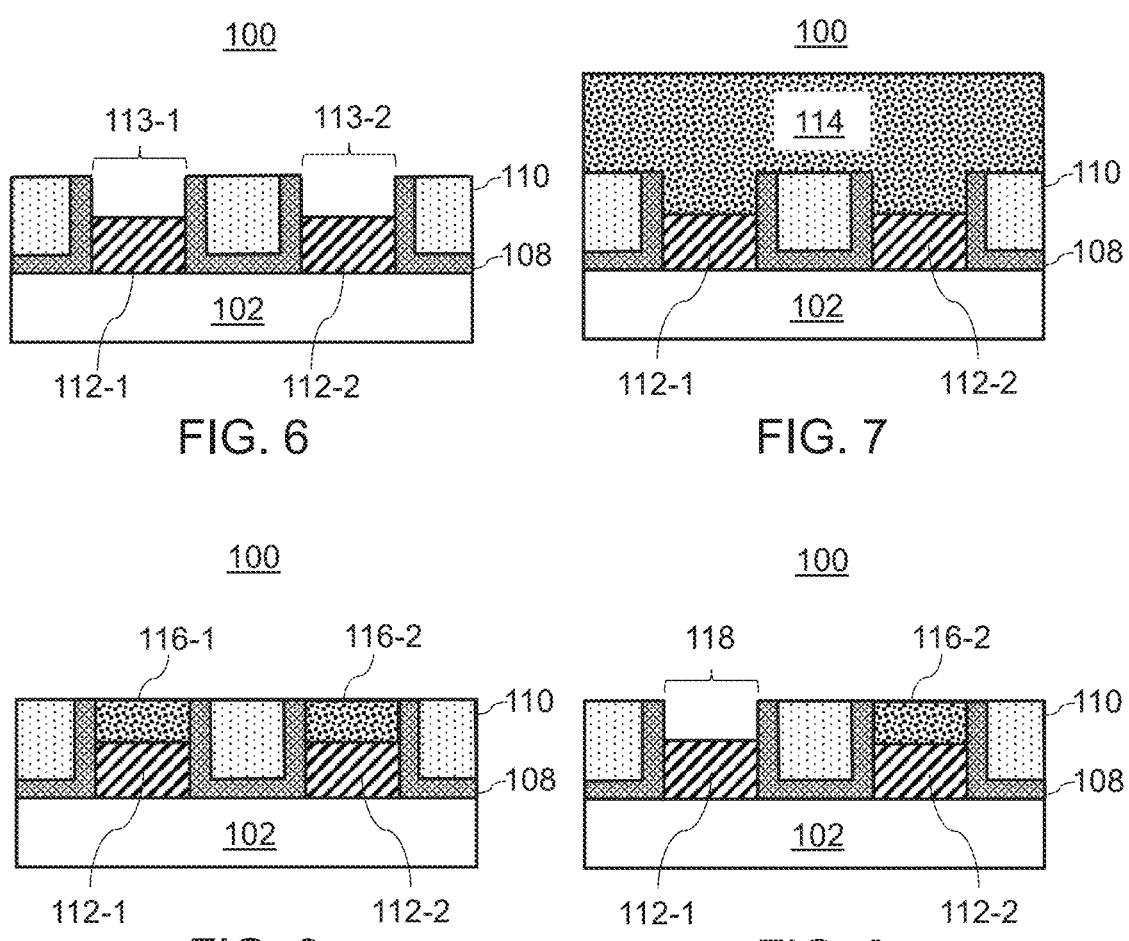
FIG. 6
FIG. 7
FIG. 8
FIG. 9
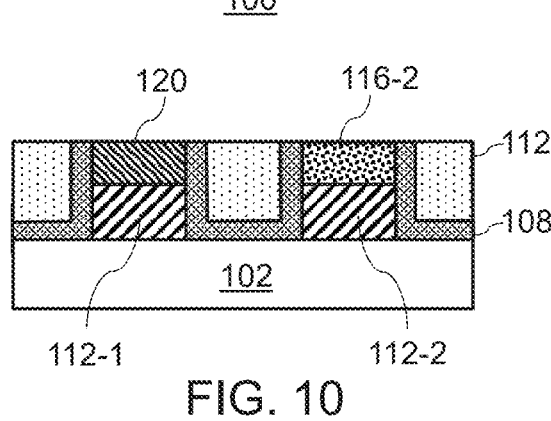
FIG. 10

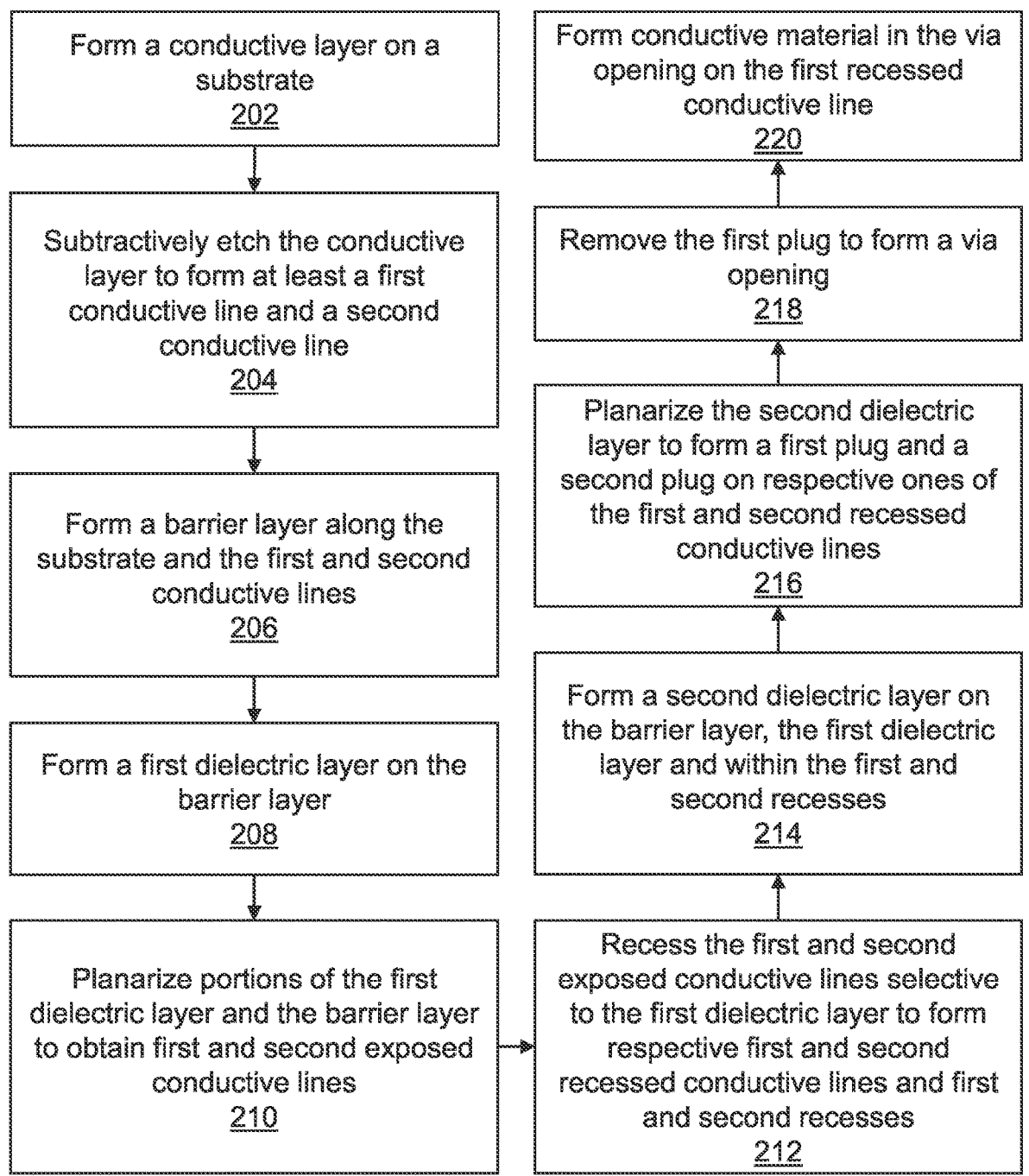

200

Form a conductive layer on a substrate
202

Subtractively etch the conductive layer to form at least a first conductive line and a second conductive line
204

Form a barrier layer along the substrate and the first and second conductive lines
206

Form a first dielectric layer on the barrier layer
208

Planarize portions of the first dielectric layer and the barrier layer to obtain first and second exposed conductive lines
210

Recess the first and second exposed conductive lines selective to the first dielectric layer to form respective first and second recessed conductive lines and first and second recesses
212

Form a second dielectric layer on the barrier layer, the first dielectric layer and within the first and second recesses
214

Planarize the second dielectric layer to form a first plug and a second plug on respective ones of the first and second recessed conductive lines
216

Remove the first plug to form a via opening
218

Form conductive material in the via opening on the first recessed conductive line
220

TOP VIA ON SUBTRACTIVELY ETCHED CONDUCTIVE LINE

BACKGROUND

The present invention generally relates to semiconductor devices, and more particularly to top via formation.

Generally, semiconductor devices can include a plurality of circuits which form an integrated circuit fabricated on a substrate. A complex network of signal paths can be routed to connect the circuit elements distributed on the surface of the substrate. Efficient routing of these signals can include the formation of multilevel or multilayered interconnect schemes (e.g., single or dual damascene wiring structures) during the back-end-of-line (BEOL) phase of manufacturing. In addition to signal paths, power can be distributed by interconnect structures from the top-most metallization levels in the BEOL stack down to the device level.

Within an interconnect structure, conductive vias can run perpendicular to the substrate and conductive lines can run parallel to the substrate. In a typical dual damascene approach to forming interconnects, vias are generally patterned below conductive lines, rather than above conductive lines, which can make via patterning difficult.

SUMMARY

In accordance with an embodiment of the present invention, a method for fabricating a semiconductor device including a self-aligned top via is provided. The method includes subtractively etching a conductive layer to form at least a first conductive line on a substrate. After the subtractive etching, the method further includes forming a barrier layer along the substate and along the first conductive line, planarizing at least portions of the barrier layer to obtain at least an exposed first conductive line, recessing at least the exposed first conductive line to form a first recessed conductive line, and forming conductive material in a via opening on the first recessed conductive line.

In accordance with another embodiment of the present invention, a method for fabricating a semiconductor device including a self-aligned top via is provided. The method includes subtractively etching a conductive layer to form at least first and second conductive lines on a substrate, recessing the first and second conductive lines to form respective first and second recessed conductive lines, forming a first plug and a second plug on respective ones of the first and second recessed conductive lines, removing the first plug to form a via opening, and forming conductive material in the via opening on the first recessed conductive line.

In accordance with yet another embodiment of the present invention, a semiconductor device including a self-aligned top via is provided. The device includes a substrate, a first structure disposed on the substrate and a second structure disposed on the substrate. The first structure includes a self-aligned via disposed on a first conductive line having a geometry resulting from a subtractive etch process, and the second structure includes a plug disposed on a second conductive line having a geometry resulting from the subtractive etch process.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 1 is a cross-sectional view of the formation of conductive material on a substrate during the fabrication of a semiconductor device, in accordance with an embodiment of the present invention;

FIG. 2 is a cross-sectional view of the formation of a first conductive line and a second conductive line from the conductive material during the fabrication of the semiconductor device, in accordance with another embodiment of the present invention;

FIG. 3 is a cross-sectional view of the formation of a barrier layer along the conductive lines and the substrate during the fabrication of the semiconductor device, in accordance with an embodiment of the present invention;

FIG. 4 is a cross-sectional view of the formation of a first dielectric layer on the barrier layer and between the conductive lines during the fabrication of the semiconductor device, in accordance with an embodiment of the present invention;

FIG. 5 is a cross-sectional view of planarization performed to expose the first and second conductive lines during the fabrication of the semiconductor device, in accordance with an embodiment of the present invention;

FIG. 6 is a cross-sectional view of the formation of first and second recesses and first and second recessed conductive lines during the fabrication of the semiconductor device, in accordance with an embodiment of the present invention;

FIG. 7 is a cross-sectional view of the formation of a second dielectric layer within the recesses during the fabrication of a semiconductor device, in accordance with another embodiment of the present invention;

FIG. 8 is a cross-sectional view of the formation of first and second plugs on the first and second conductive lines, respectively, during the fabrication of the semiconductor device, in accordance with another embodiment of the present invention;

FIG. 9 is a cross-sectional view of the removal of the first plug to expose the first recessed conductive line during the fabrication of the semiconductor device, in accordance with another embodiment of the present invention;

FIG. 10 is a cross-sectional view of the selective growth of conductive material on the first recessed conductive line during the fabrication of the semiconductor device, in accordance with another embodiment of the present invention;

FIG. 11 is a block/flow diagram illustrating a system/method for fabricating a semiconductor device including a self-aligned top via, in accordance with an embodiment of the present invention.

DETAILED DESCRIPTION

Figure 12:
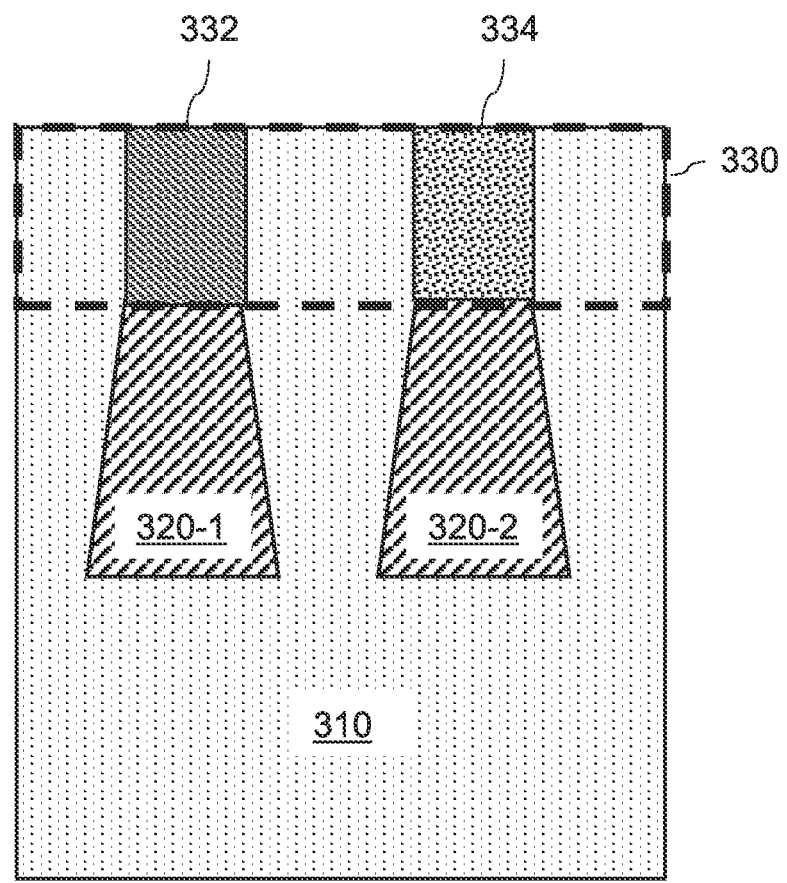
FIG. 12 is a cross-sectional view of a semiconductor device including a self-aligned via, in accordance with an embodiment of the present invention.

Patterning a via at the top of a conductive line, referred to herein as a top via, can be difficult and can lead to variability in via dimensions. Conductive line height can be challenged when the line recess is combined with a via patterning step that uses metal reactive-ion etching (RIE) process. In addition, overlay between the conductive line and top via can potentially result in misalignment at fine dimensions.

To address at least the above-noted concerns, the embodiments described herein provide for the formation a damascene via on top of a subtractively etched conductive line, referred to herein as a damascene top via. The damascene top via is self-aligned to the subtractively etched conductive line. The damascene top via can include a different conductive material than the conductive line. Uniform recess of conductive lines can be achieved without patterning (e.g., can be done with wet etching). The via patterning can be performed with dielectric reactive-ion etching (RIE), and no metal RIE is required for performing the via etch.

Since the conductive line is subtractively etched starting from a blanket formation of conductive material, the dielectric material surrounding the subtractively etched conductive line does not include an etch-induced damage layer, thus giving it a lower effective dielectric constant than the same dielectric material would have if it did include an etch-induced damage layer. In addition, by forming the conductive line using a subtractive etch process rather than using a damascene process, better control over conductive line height variability can be attained.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a semiconductor device 100 is shown including a substrate 102.

The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

As further shown in FIG. 1, a conductive layer 104 formed on the substrate. The conductive layer 104 can include any suitable material in accordance with the embodiments described herein. Examples of materials that can be used to form the conductive layer 104 include, but are not limited to, copper (Cu), cobalt (Co), ruthenium (Ru), and/or other suitable conductive materials or metals. In some embodiments, the conductive layer 104 can include combinations of materials (e.g., alloys) that show have low resistance properties. Examples of such combinations include, but are not limited to, copper-germanium (CuGe) and cobalt silicon ($Co_2Si$).

As will be described in further detail below with reference to FIG. 2, the conductive layer 104 will be subtractively etched to form conductive lines. The selection of material for the conductive layer 104 can be determined based on the dimensions of the conductive lines. For example, for lines with a width of about 15 nm or greater, Cu can be selected as the material for the conductive layer 104. However, for lines with a width of about 15 nm or smaller, Ru can be selected as the material for the conductive layer 104. Additionally, Ru is generally easier to subtractively etch than Cu.

Although not shown, an optional adhesion layer can be formed on the bottom of the conductive layer 104. Examples of suitable materials that can be used to form the adhesion layer include, but are not limited to, tantalum (Ta), tantalum nitride (TaN), titanium (Ti) and titanium nitride (TiN).

With reference to FIG. 2, conductive lines 106-1 and 106-2 are formed from the conductive layer 104. More specifically, a pair of masks (not shown) can be formed on conductive layer 104 in locations corresponding to the conductive lines 106-1 and 106-2, and a subtractive etch process can be performed on the conductive layer 104 using the masks to form the conductive lines 106-1 and 106-2. For example, the subtractive etch process can include a subtractive metal reactive-ion etch (RIE) process. However, any suitable etching process can be used to form the conductive lines 106-1 and 106-2 in accordance with the embodiments described herein.

With reference to FIG. 3, a barrier layer 108 can be formed along the substrate 102 and the conductive lines 106-1 and 106-2. As shown in FIG. 3, the barrier layer 108 can be formed using conformal deposition. The barrier layer 108 can include any suitable material in accordance with the embodiments described herein.

In the embodiment shown herein, the barrier layer 108 includes dielectric barrier layer material. However, in another embodiment, the barrier layer 108 can include conductive (e.g., metal) barrier layer material. If the barrier layer 108 includes a conductive barrier layer material, in order to avoid shorting the conductive lines 106-1 and 106-2, an additional etch step can take place after the barrier layer 108 is formed to remove the portions of the conductive barrier layer material in the region between the conductive lines 106-1 and 106-2.

Examples of materials that can be used to form the barrier layer 108 include, but are not limited to, tantalum (Ta), titanium (Ti), tungsten W, tantalum nitride (TaN), titanium nitride (TiN), tungsten nitride (WN), doped or undoped silicon carbide (SiC), doped or undoped silicon nitride (e.g., SiN), doped or undoped silicon carbonitride (SiCN) etc.

With reference to FIG. 4, a dielectric layer 110 is formed on the barrier layer 108. The dielectric layer 110 can include any suitable material in accordance with the embodiments described herein, and can be formed using any suitable process in accordance with the embodiments described herein.

In one embodiment, the dielectric layer 110 includes a low-k dielectric material. A low-k dielectric material is a material with a dielectric constant k less than the dielectric constant of $SiO_2$ at room temperature (e.g., about 20° C.-25° C.) and atmospheric pressure (e.g., about 1 atm). For example, a low-k dielectric material can have a dielectric constant of less than about 3.9. The dielectric layer 110 can have a dielectric constant k between, e.g., about 2.3 and 2.7. For example, the dielectric layer 110 can include an ultra-low k (ULK) dielectric material having a dielectric constant less than or equal to, e.g., about 2.5. Examples of suitable materials that can be used to form the dielectric layer 110 include, but are not limited to, octamethylcyclotetrasiloxane (OMCTS), flowable low-k dielectrics (FCVD), spin-on glass dielectrics (SOG), porous SiCN, etc.

With reference to FIG. 5, portions of the dielectric layer 110 and the barrier layer 108 are planarized to expose the conductive lines 106-1 and 106-2. For example, chemical-mechanical planarization (CMP) can be used. However, such an embodiment should not be considered limiting.

Since the conductive lines 106-1 and 106-2 were already formed by subtractive etching, the dielectric layer 110 surrounding the conductive lines 106-1 and 106-2 does not include an etch-inducted damage layer, thus giving it a lower effective dielectric constant than the same dielectric material would have if it did include an etch-induced damage layer. Contact with etch-induced damage layers can increase capacitance of the conductive lines 106-1 and 106-2, thereby decreasing performance.

With reference to FIG. 6, the first and second conductive lines 106-1 and 106-2 are recessed selective to the dielectric layer 110 to form recessed conductive lines 112-1 and 112-2 and recesses 113-1 and 113-2. Any suitable process can be used to form the recessed conductive lines 112-1 and 112-2, and the recesses 113-1 and 113-2 in accordance with the embodiments described herein.

With reference to FIG. 7, dielectric layer 114 is formed on the barrier layer 108, the dielectric layer 110 and within the recesses 113-1 and 113-2.

The dielectric layer 114 can include any suitable dielectric material in accordance with the embodiments described herein.

In one embodiment, the dielectric layer 114 can include a low-k dielectric material, which can have the same or similar dielectric constant k as the material of the dielectric layer 110 described above with reference to FIG. 4. In other embodiments, the dielectric layer 114 can include dielectric material having a higher dielectric constant k such as, e.g., SiN and SiCN. As will be described in further detail below, the dielectric layer 114 can include a higher-k dielectric material than the dielectric layer 110 since the dielectric layer 114 will only remain on conductive lines without vias, and thus the capacitance penalty of using a higher-k dielectric for the dielectric layer 114 is mitigated.

With reference to FIG. 8, the dielectric layer 114 is planarized to form plugs 116-1 and 116-2. The plug 116-1 is formed on the recessed conductive line 112-1 and the plug 116-2 is formed on the recessed conductive line 112-2. For example, CMP can be used. However, such an embodiment should not be considered limiting.

With reference to FIG. 9, a via opening 118 is formed by removing the plug 116-1. The via opening 118 can correspond to the recess 113-1 described above with reference to FIG. 6. The via opening 118 can be formed by etching the plug 116-1 using a mask. Although not shown, a liner can be formed after the plug 116-1 is removed.

With reference to FIG. 10, conductive material 120 is formed in the via opening 118 on the recessed conductive line 116-1. The conductive material 120 can include any suitable material in accordance with the embodiments described herein. Examples of materials that can be used to form the conductive material 110 include, but are not limited to, copper (Cu), cobalt (Co), ruthenium (Ru), and/or other suitable conductive materials or metals. In some embodiments, the conductive material 120 can include combinations of materials (e.g., alloys) that show have low resistance properties. Examples of such combinations include, but are not limited to, copper-germanium (CuGe) and cobalt silicon (Co₂Si). The conductive material 120 can include a different material than the recessed conductive lines 112-1 and 112-2.

In one embodiment, the conductive material 120 can be selectively grown in the via opening 118. More specifically, the exposed surface of the recessed conductive line 112-1 can be exposed to a precursor, and the conductive material 120 can be grown in the via opening 118 on top of the exposed surface of the recessed conductive line 112-1 without growing on the surrounding exposed dielectric materials.

In another embodiment, the conductive material 120 can be formed by depositing a blanket conductive film filling the via opening 118 (e.g., using atomic layer deposition (ALD) or other suitable deposition technique), and planarizing the blanket film down to expose the top of the dielectric material (e.g. using CMP). In this embodiment, an adhesion layer can be formed within the via opening 118 prior to the via opening 118 being filled with the conductive film to promote quality gap-fill of the conductive material 120.

The process flow described above with reference to FIGS. 6-10 collectively form a damascene top via self-aligned to a conductive line. The process flow described above with reference to FIGS. 1-10 corresponds to a process of forming a first metallization level of a semiconductor device. The process flow can be repeated by to form other metallization levels of the semiconductor device.

With reference to FIG. 11, a block/flow diagram is provided illustrating a system/method 200 for fabricating a semiconductor device including a self-aligned top via.

At block 202, a conductive layer is formed on a substrate. In one embodiment, barrier material can be formed on the bottom of the conductive layer.

The substrate can include any suitable substrate structure, e.g., a bulk semiconductor, a semiconductor-on-insulator (SOI) substrate, etc. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide.

The conductive layer can include any suitable material in accordance with the embodiments described herein. Examples of materials that can be used to form the conductive layer 104 include, but are not limited to, copper (Cu), cobalt (Co), ruthenium (Ru), and/or other suitable conductive materials or metals. In some embodiments, the conductive layer can include combinations of materials (e.g., alloys) that show have low resistance properties. Examples of such combinations include, but are not limited to, copper-germanium (CuGe) and cobalt silicon (Co₂Si).

As will be described in further detail below the conductive layer will be subtractively etched to form conductive lines. The selection of material for the conductive layer can be determined based on the dimensions of the conductive lines. For example, for lines with a width of about 15 nm or greater, Cu can be selected as the material for the conductive layer. However, for lines with a width of about 15 nm or smaller, Ru can be selected as the material for the conductive layer. Additionally, Ru is generally easier to subtractively etch than Cu.

In one embodiment, forming the conductive layer can further include forming an adhesion layer can be formed on the substrate prior to forming the conductive layer. Examples of suitable materials that can be used to form the adhesion layer include, but are not limited to, tantalum (Ta), tantalum nitride (TaN), titanium (Ti) and titanium nitride (TiN).

Further details regarding block 202 are provided above with reference to FIG. 1.

At block 204, the conductive layer is subtractively etched to form at least a first conductive line and a second conductive line. More specifically, subtractively etching the conductive layer includes forming at least one mask corresponding to locations of the conductive lines, and subtractively etching the conductive layer using the at least one mask to form the conductive lines. In one embodiment, a subtractive metal reactive-ion etch process (RIE) is used to form the conductive lines. However, any suitable etch process can be used to form the conductive lines in accordance with the embodiments described herein.

Further details regarding block 204 are provided above with reference to FIG. 2.

At block 206, a barrier layer is formed along the substrate and the first and second conductive lines. For example, the barrier layer can be conformally deposited along the substrate and the conductive lines. The barrier layer can include any suitable material in accordance with the embodiments described herein.

In one embodiment, the barrier layer includes dielectric barrier layer material. In another embodiment, the barrier layer includes a conductive (e.g., metal) barrier layer material. If the barrier layer includes a conductive barrier layer material, in order to avoid shorting the conductive lines, an additional etch step can take place after the barrier layer is formed to remove the portions of the conductive barrier layer material in the region between the conductive lines.

Examples of materials that can be used to form the barrier layer include, but are not limited to, tantalum (Ta), titanium (Ti), tungsten W, tantalum nitride (TaN), titanium nitride (TiN), tungsten nitride (WN), doped or undoped silicon carbide (SiC), doped or undoped silicon nitride (e.g., SiN), doped or undoped silicon carbonitride (SiCN) etc.

Further details regarding block 206 are provided above with reference to FIG. 3.

At block 208, a first dielectric layer is formed on the barrier layer. The first dielectric layer can include any suitable material in accordance with the embodiments described herein. In one embodiment, the first dielectric layer includes a low-k dielectric material. For example, the first dielectric layer can include an ultra-low k (ULK) dielectric material having a dielectric constant less than or equal to, e.g., about 2.5. Examples of suitable materials that can be used to form the first dielectric layer include, but are not limited to, octamethylcyclotetrasiloxane (OMCTS), flowable low-k dielectrics (FCVD), spin-on glass dielectrics (SOG), porous SiCN, etc.

Further details regarding block 208 are provided above with reference to FIG. 4.

At block 210, portions of the first dielectric layer and the barrier layer are planarized to obtain first and second exposed conductive lines. For example, planarizing the portions of the first dielectric layer and the barrier layer can include using chemical-mechanical planarization (CMP). However, such an embodiment should not be considered limiting.

Since the conductive lines were already formed by subtractive etching, the first dielectric layer surrounding the conductive lines does not include an etch-inducted damage layer, thus giving it a lower effective dielectric constant than the same dielectric material would have if it did include an etch-induced damage layer. Contact with etch-induced damage layers can increase capacitance of the conductive lines, thereby decreasing performance.

Further details regarding block 210 are provided above with reference to FIG. 5.

At block 212, the first and second exposed conductive lines are recessed selective to the first dielectric layer to form respective first and second recessed conductive lines and first and second recesses. Any suitable process can be used to recess the first and second conductive lines in accordance with the embodiments described herein.

Further details regarding block 212 are provided above with reference to FIG. 6.

At block 214, a second dielectric layer is formed on the barrier layer, the first dielectric layer and within the first and second recesses. The second dielectric layer can include any suitable dielectric material in accordance with the embodiments described herein. In one embodiment, the second dielectric layer can include a low-k dielectric material, which can have the same or similar dielectric constant k as the material of the first dielectric layer. In other embodiments, the second dielectric layer can include dielectric material having a higher dielectric constant k such as, e.g., SiN and SiCN. As will be described in further detail below, the second dielectric layer can include a higher-k dielectric material than the first dielectric layer since the second dielectric layer will only remain on conductive lines without vias, and thus the capacitance penalty of using a higher-k dielectric for the second dielectric layer is mitigated.

Further details regarding block 214 are provided above with reference to FIG. 7.

At block 216, the second dielectric layer is planarized to form a first plug and a second plug on respective ones of the first and second recessed conductive lines. In one embodiment, planarizing the second dielectric layer includes using CMP. However, such an embodiment should not be considered limiting.

Further details regarding block 216 are provided above with reference to FIG. 8.

At block 218, the first plug is removed to form a via opening. More specifically, removing the first plug to form the via opening can include etching the first plug using a mask, and then removing the mask after the etching. The via opening corresponds to the first recess.

Further details regarding block 218 are provided above with reference to FIG. 9.

At block 220, conductive material is formed in the via opening on the first recessed conductive line. The conductive material can include any suitable material in accordance with the embodiments described herein. Examples of materials that can be used to form the conductive material include, but are not limited to, copper (Cu), cobalt (Co), ruthenium (Ru), and/or other suitable conductive materials or metals. The conductive material can include a different material than the recessed conductive lines. In some embodiments, the conductive material can include combinations of materials (e.g., alloys) that show have low resistance properties. Examples of such combinations include, but are not limited to, copper-germanium (CuGe) and cobalt silicon ($Co_2Si$).

In one embodiment, forming the conductive material includes selectively growing the conductive material in the via opening. More specifically, forming the conductive material can include exposing an exposed surface of the first recessed conductive line to a precursor, and growing the conductive material in the via opening on top of the exposed surface of the first recessed conductive line without growing on the surrounding exposed dielectric materials.

In another embodiment, forming the conductive material includes depositing a blanket conductive film filling the via opening (e.g., using atomic layer deposition (ALD) or other suitable deposition technique), and planarizing the blanket film down to expose the top of the dielectric material (e.g. using CMP). In this embodiment, an adhesion layer can be formed within the via opening prior to the via opening being filled with the conductive film to promote quality gap-fill of the conductive material.

Blocks 212 through 220 collectively form a damascene top via self-aligned to a conductive line. The process flow described above in FIG. 11 corresponds to a process of forming a first metallization level of a semiconductor device. The process flow of FIG. 11 can be repeated by to form other metallization levels of the semiconductor device.

With reference to FIG. 12, a semiconductor device including a self-aligned via 300 is shown. The device 300 includes a dielectric layer 310, conductive lines 320-1 and 320-2, and a via region 330.

The dielectric layer 310 can include the same or similar dielectric material as the dielectric layer 110 described above with reference to FIGS. 4 and 5.

The plug 334 includes a dielectric material, which can be the same or similar to the dielectric material of the plug 116-2 described above with reference to FIGS. 7 and 8.

The via region 330 includes a self-aligned via 332 disposed on the conductive line 320-1, and a plug 334 disposed on the conductive line 320-2.

As shown, the conductive lines 320-1 and 320-2 can be in the shape of a trapezoidal prism including two trapezoid bases connected by four rectangular lateral faces. More specifically, each of the two trapezoidal bases can be in the form of an isosceles trapezoid in which the two legs connecting the top trapezoid base to the bottom trapezoid base have the same length. Here, the conductive lines 320-1 and 320-2 are formed using a subtractive etch process on a block of conductive material. This is evidenced by the top trapezoid base having a shorter length than the bottom trapezoid base. Accordingly, the conductive lines 320-1 and 320-2 each have a geometry resulting from a subtractive etch process.

The formation of the conductive lines 320-1 and 320-2 using a subtractive etch process can be contrasted with the formation of conductive lines using a damascene trench formation process. In a damascene trench formation process, instead of subtractively etching away material from a conductive layer (such as conductive lines 320-1 and 320-2 shown in FIG. 3), conductive lines can be formed by forming respective trenches, and filling the trenches with conductive material. However, with conductive lines formed using a damascene trench formation process, the top trapezoid base of the conductive lines would have a longer length than the bottom trapezoid base of the conductive lines.

The embodiments described herein provide for the formation a damascene top via self-aligned to a subtractively etched conductive line. The damascene top via can include a different conductive material than the conductive line. Uniform recess of conductive lines can be achieved without patterning (e.g., can be done with wet etching). The via patterning can be performed with dielectric reactive-ion etching (RIE), and no metal RIE is needed for performing the via etch.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device including a self-aligned top via, comprising:
   a substrate;
   a first structure disposed on the substrate, the first structure including a self-aligned via disposed on a first conductive line, the first conductive line having a tapered geometry with a top width being more narrow than a bottom width resulting from a subtractive etch process, the self-aligned via having a top surface; and
   a second structure disposed on the substrate, the second structure including a plug disposed on a second conductive line, the second conductive line having a tapered geometry with a top width being more narrow than a bottom width resulting from the subtractive etch process, the plug having a top surface in a same plane as the top surface of the self-aligned via.

2. The device of claim 1, further comprising dielectric material disposed on the substrate separating the first structure from the second structure.

3. The device of claim 2, wherein the dielectric material separating the first structure from the second structure includes a conformal barrier layer disposed along sidewalls of the first structure and the second structure, and a dielectric layer disposed on the conformal barrier layer.

4. The device of claim 1, wherein the plug includes dielectric material.

5. The device of claim 3, wherein the first conductive line is recessed selective to the dielectric layer.

6. The device of claim 1, wherein the second conductive line is an exposed conductive line, the second conductive line being a recessed conductive line.

7. The device of claim 1, further comprising a second plug on the second conductive line, the second conductive line being a recessed conductive line.

8. A semiconductor device including a self-aligned top via, comprising:
   a substrate;
   a first structure disposed on the substrate, the first structure including a self-aligned via disposed on a first recessed conductive line, the first recessed conductive line having a tapered geometry with a top width being more narrow than a bottom width resulting from a subtractive etch process, the self-aligned via having a top surface; and
   a self-aligned top via opening formed on the first recessed conductive line; and
   a second structure disposed on the substrate, the second structure including a plug disposed on a second conductive line, the second recessed conductive line having a tapered geometry with a top width being more narrow than a bottom width resulting from the subtractive etch process, the plug having a top surface in a same plane as the top surface of the self-aligned via.

9. The device of claim 8, further comprising dielectric material disposed on the substrate separating the first structure from the second structure.

10. The device of claim 9, wherein the dielectric material separating the first structure from the second structure includes a conformal barrier layer disposed along sidewalls of the first structure and the second structure, and a dielectric layer disposed on the conformal barrier layer.

11. The device of claim 8, wherein the plug includes dielectric material.

12. The device of claim 10, wherein the first recessed conductive line is recessed selective to the dielectric layer.

13. The device of claim 8, wherein the second conductive line is an exposed conductive line, the second conductive line being a recessed conductive line.

\* \* \* \* \*